(12) United States Patent
Kitahara

(10) Patent No.: US 10,201,936 B2
(45) Date of Patent: Feb. 12, 2019

(54) JIG AND PROCESSING METHOD USING JIG

(71) Applicant: DISCO CORPORATION, Tokyo (JP)

(72) Inventor: Nobuyasu Kitahara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 7 days.

(21) Appl. No.: 15/409,664

(22) Filed: Jan. 19, 2017

(65) Prior Publication Data

US 2017/0210060 A1    Jul. 27, 2017

(30) Foreign Application Priority Data

Jan. 21, 2016  (JP) ................. 2016-009565

(51) Int. Cl.

| | |
|---|---|
| *B29C 65/50* | (2006.01) |
| *B29C 65/16* | (2006.01) |
| *B29C 65/52* | (2006.01) |
| *B29C 65/78* | (2006.01) |
| *H01L 21/683* | (2006.01) |
| *H01L 21/67* | (2006.01) |

(52) U.S. Cl.
CPC .............. *B29C 65/50* (2013.01); *B29C 65/16* (2013.01); *B29C 65/52* (2013.01); *B29C 65/7802* (2013.01); *H01L 21/6835* (2013.01); *H01L 21/67092* (2013.01); *H01L 21/67132* (2013.01); *H01L 21/6836* (2013.01); *H01L 2221/68313* (2013.01); *H01L 2221/68327* (2013.01)

(58) Field of Classification Search
CPC ..... B29C 65/7802; B29C 65/16; B29C 65/50; B29C 65/52; H01L 21/6835

USPC .................................................. 156/265, 297
See application file for complete search history.

(56) References Cited

U.S. PATENT DOCUMENTS

| | | | | |
|---|---|---|---|---|
| 6,033,933 A | * | 3/2000 | Hur | ........................ H01L 21/565 257/E21.504 |
| 7,061,123 B1 | * | 6/2006 | Chee | .................... H01L 23/5389 257/777 |
| 2008/0020548 A1 | * | 1/2008 | Morikazu | ................ H01L 21/78 438/463 |

FOREIGN PATENT DOCUMENTS

| | | |
|---|---|---|
| JP | 2003-045823 | 2/2003 |
| JP | 2006-156896 | 6/2006 |

\* cited by examiner

*Primary Examiner* — Philip C Tucker
*Assistant Examiner* — John Blades
(74) *Attorney, Agent, or Firm* — Greer Burns & Crain, Ltd.

(57) ABSTRACT

A jig for assisting in aligning a plurality of rectangular workpieces is in the form of a plate having a plurality of grooves parallel to each other. The grooves have respective one ends aligned straight with each other and have a depth smaller than the thickness of the workpieces. After the workpieces have been fitted in the respective grooves, an adhesive tape is applied to the workpieces and the workpieces are transferred from the jig to the adhesive tape, so that the workpieces are arrayed in alignment with each other on the adhesive tape. The workpieces on the adhesive tape are prevented from being placed in different positions and orientations, and can subsequently be processed efficiently.

4 Claims, 5 Drawing Sheets

JIG AND PROCESSING METHOD USING JIG

BACKGROUND OF THE INVENTION

Field of the Invention

The present invention relates to a jig for aligning a plurality of rectangular workpieces with each other, and a processing method using such a jig.

Description of the Related Art

For dividing a workpiece such as a wafer into individual chips, it has been customary to form dividing grooves along streets in the workpiece with a scriber of a scribing apparatus disclosed in Japanese Patent Laid-open No. 2003-45823, for example, and then to apply external forces to the workpiece to break the workpiece into individual chips along the dividing grooves, using a breaking apparatus disclosed in Japanese Patent Laid-open No. 2006-156896, for example. In order to prevent the individual chips from being scattered around when the workpiece is divided, an adhesive tape is applied to an annular ring frame having a central opening, and the workpiece is supported on the ring frame by the adhesive tape by directing one surface of the workpiece upwardly and applying the other surface of the workpiece to the portion of the adhesive tape which is exposed through the central opening of the annular ring frame.

If the workpiece to be processed is a rectangular workpiece 10 as shown in FIG. 7 of the accompanying drawings, then a plurality of workpieces 10 may be arranged in an array and applied to an adhesive tape 11, so that the workpieces 10 may be supported on a ring frame 12 by the adhesive tape 11.

SUMMARY OF THE INVENTION

Providing the workpieces 10 are arranged on the adhesive tape 11 so that they have respective one ends aligned in line with each other, the workpieces 10 can be processed in one cycle of operation. However, since it has been the practice for the worker to manually place the workpieces 10 on the adhesive tape 11, it is difficult to keep the ends of the workpieces 10 in line with each other on the adhesive tape 11. According to a solution to the problem, an image of each of the workpieces 10 is captured, and the distance from one end to the other thereof is measured by processing the captured image, after which each workpiece 10 is processed on the basis of the image thus measured. However, this approach is poor in efficiency.

It is an object of the present invention to provide a jig capable of aligning a plurality of rectangular workpieces parallel to each other with one ends thereof being kept in line with each other, and a processing method for processing a plurality of rectangular workpieces using such a jig.

In accordance with an aspect of the present invention, there is provided a jig for assisting in aligning a plurality of rectangular workpieces, including a plate having a plurality of grooves parallel to each other, the grooves having respective one ends aligned straight with each other and having a depth smaller than the thickness of the workpieces. After the workpieces have been fitted in the respective grooves, an adhesive tape is applied to the workpieces and the workpieces are transferred from the jig to the adhesive tape, so that the workpieces are arrayed in alignment with each other on the adhesive tape.

In accordance with another aspect of the present invention, there is provided a processing method for processing a plurality of rectangular workpieces using a jig having a plurality of grooves parallel to each other, said grooves having respective one ends aligned straight with each other and having a depth smaller than the thickness of the workpieces. The processing method includes: a fitting step of fitting the workpieces in the respective grooves of the jig; a transferring step of, after the fitting step, applying an adhesive tape to first faces of the workpieces which are opposite second faces thereof that have been fitted in the grooves of the jig and transferring the workpieces from the jig to said adhesive tape, so that the workpieces are arrayed in alignment on the adhesive tape; and a processing step of, after the transferring step, processing the arrayed workpieces on said adhesive tape.

The jig according to the present invention is in the form of the plate having the grooves that are parallel to each other, with the respective one ends of the grooves being aligned in line with each other, and the depth of the grooves being smaller than the thickness of the workpieces. After the workpieces have been fitted in the respective grooves, the adhesive tape is applied to the workpieces, which are transferred from the jig to the adhesive tape. The workpieces thus transferred to the adhesive tape are aligned in a straight array on the adhesive tape. Therefore, the workpieces on the adhesive tape are prevented from being placed in different positions and orientations, and can subsequently be processed efficiently.

The processing method according to the present invention includes the fitting step of fitting the workpieces in the respective grooves of the jig, the transferring step of applying the adhesive tape to the first faces of the workpieces which are opposite the second faces thereof that have been fitted in the grooves of the jig and transferring the workpieces from the jig to the adhesive tape, so that the workpieces are arrayed straight on the adhesive tape, and the processing step of processing the arrayed workpieces on the adhesive tape. Consequently, the workpieces can be applied in a straight array on the adhesive tape, and hence can subsequently be processed efficiently.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

1. Details of Workpiece

Figure 1:
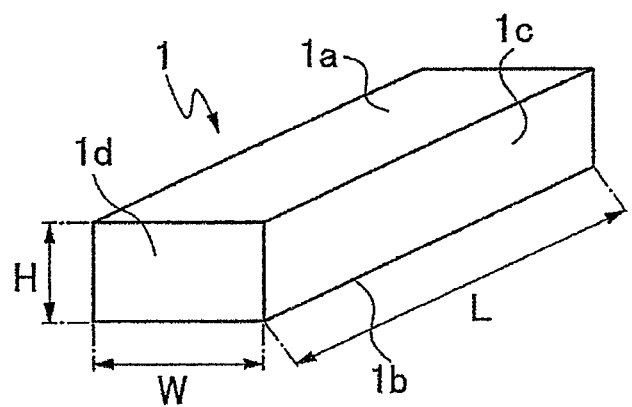
FIG. 1 is a perspective view of a rectangular workpiece.

In FIG. 1, a workpiece 1 is illustrated as a rectangular workpiece by way of example, and is made of a single crystal of indium phosphide (InP), for example. The workpiece 1 has a first face 1a as an upper surface, a second face 1b opposite the first face 1a, a pair of side faces 1c extending in the longitudinal directions of the workpiece 1, and a pair of end faces 1d extending in the transverse directions of the workpiece 1. The workpiece 1 is not limited to any dimensions, but may have a height H of 80 µm, a width W of 200 µm, and a length L of 20 mm, for example.

2. Details of Jig

Figure 2:
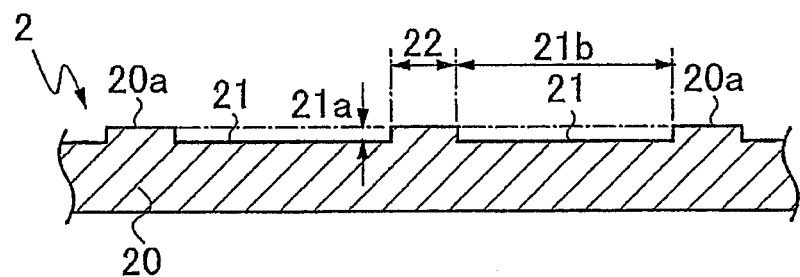
FIG. 2 is an enlarged fragmentary cross-sectional view of a jig.

A jig 2 shown in FIG. 2 is used when a plurality of workpieces 1 are applied and transferred to an adhesive tape, and serves to assist in aligning the workpieces 1 with each other. The jig 2 is in the form of a plate 20 having a plurality of grooves 21 defined in a surface thereof and extending parallel to each other for fitting the workpieces 1 therein. The plate 20 is made of silicon (Si), for example. The grooves 21 are formed in the surface 20a of the plate 20 by laser grooving in which a laser beam is applied to form the grooves 21 in the surface 20a. The plate 20 are not limited to a particular thickness and size, but may be of a desired thickness and size.

Each of the grooves 21 has a depth 21a smaller than the thickness of the workpiece 1 shown in FIG. 1. Specifically, the depth 21a of each groove 21 may be large enough to allow the workpiece 1 to be fitted therein, and is of 15 µm, for example. Each of the grooves 21 has a width 21b slightly greater than the width W of the workpiece 1 shown in FIG. 1 to allow the workpiece 1 to enter the groove 21 with ease. The width 21b of each groove 21 is in the range from 250 to 300 µm, for example. Adjacent two of the grooves 21 are spaced from each other by an interval 22 of approximately 10 µm, for example.

Figure 3:
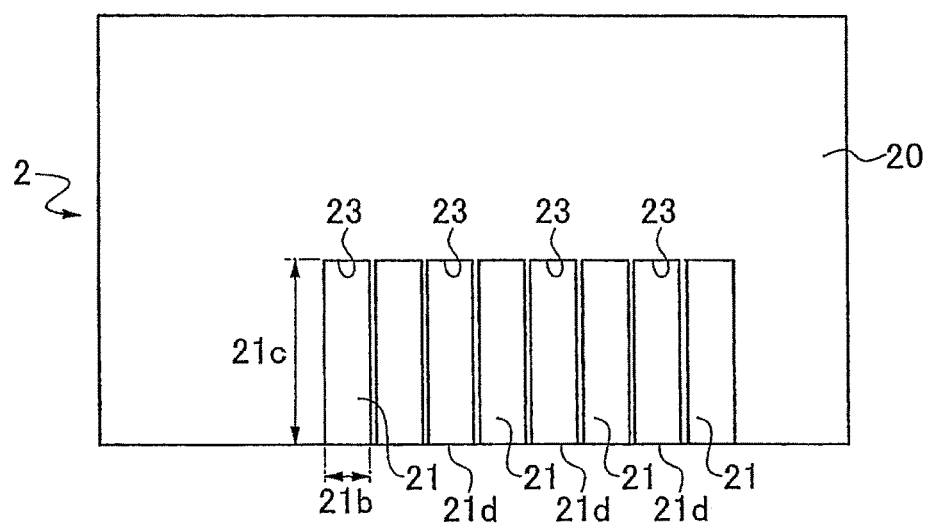
FIG. 3 is a plan view of the jig.

As shown in FIG. 3, the grooves 21 are longitudinally open at openings 21d defined in a side face of the plate 20. Each of the grooves 21 has a length 21c which is about the same as the length L of the workpiece 1 shown in FIG. 1. The grooves 21 are arrayed parallel to each other with respective one ends 23 thereof aligned in line with each other. For fitting a plurality of workpieces 1 in the respective grooves 21, the workpieces 1 are positioned roughly in alignment with and placed in the respective grooves 21, and then the end faces 1d of the workpieces 1 are brought into abutment against the respective ends 23 of the grooves 21, whereupon the end faces 1d of the workpieces 1 are aligned in line with each other. For placing the workpieces 1 in the respective grooves 21, the workpieces 1 may be either lowered from above into the grooves 21 or inserted laterally through the openings 21d into the grooves 21. Since the grooves 21 have the openings 21d, it is possible for the grooves 21 to receive therein workpieces longer than the grooves 21. The number of the grooves 21 in the plate 20 is not limited to any particular value.

As described above, the jig 2 according to the present invention is in the form of the plate 20 having the grooves 21 for fitting the workpieces 1 therein, the grooves 21 extending parallel to each other with the ends 23 thereof aligned in line with each other. When the workpieces 1 are to be processed, they are fitted in the respective grooves 21 and then an adhesive tape, for example, is applied to the workpieces 1, which are adhered and transferred from the jig 2 to the adhesive tape. The workpieces 1 thus transferred to the adhesive tape are aligned in a straight array on the adhesive tape. Therefore, the workpieces 1 on the adhesive tape are prevented from being placed in different positions and orientations, and can subsequently be processed efficiently.

3. Processing Method

A processing method for processing a plurality of workpieces 1 using the jig 2 will be described below. In the processing method according to the present embodiment, the workpieces 1 are processed by a laser beam in laser scribing to form division starter points (grooves) in the workpieces 1, and then are broken along the division starter points to divide the workpieces 1 into predetermined lengths.

(1) Fitting Step

Figure 4:
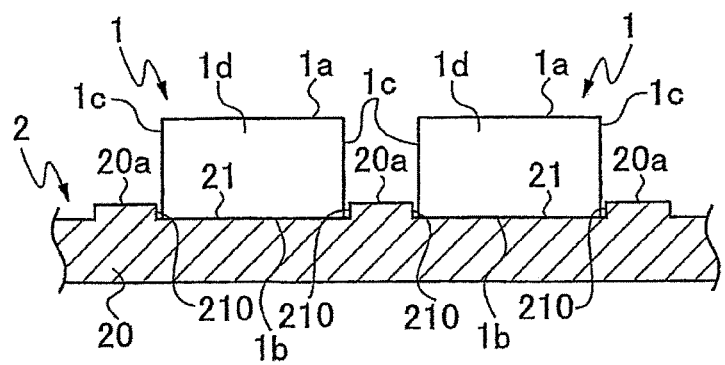
FIG. 4 is an enlarged fragmentary cross-sectional view showing a fitting step.

As shown in FIG. 4, the workpieces 1 are fitted in the respective grooves 21 of the jig 2. Specifically, the second face 1b of each of the workpieces 1 is placed in the corresponding groove 21 with the first face 1a exposed upwardly. At this time, since the pair of side faces 1c of the workpiece 1 are positioned inwardly of a pair of inner walls 210 that define the corresponding groove 21, the workpiece 1 can easily be placed in the groove 21. Furthermore, as shown in FIG. 2, inasmuch as the depth 21a of each of the grooves 21 is smaller than the thickness of the corresponding workpiece 1, the first face 1a of the workpiece 1 is positionally higher than the surface 20a of the plate 20.

Then, the end face 1d of the workpiece 1 is brought into abutment against the end 23 of the groove 21 shown in FIG. 3, thereby positioning the workpiece 1 neatly in the workpiece 21. The workpiece 21 is now fitted in the respective groove 21. The fitting step is completed when the workpieces 21 are fitted in all the grooves 21.

(2) Transferring Step

Figure 5A:
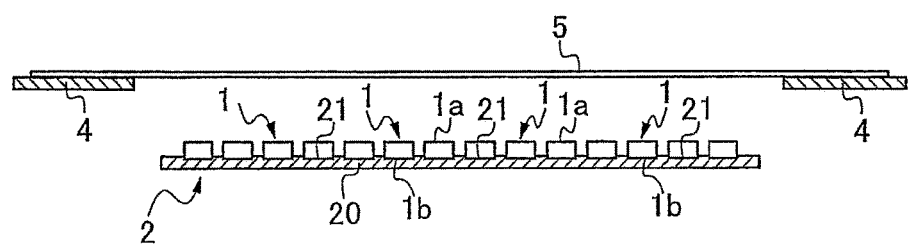
FIGS. 5A through 5C are cross-sectional views showing a transferring step.
Figure 5B:
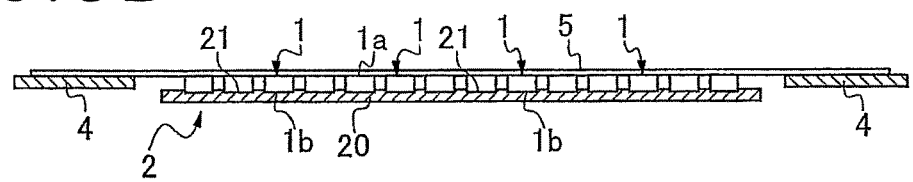
Figure 5C:
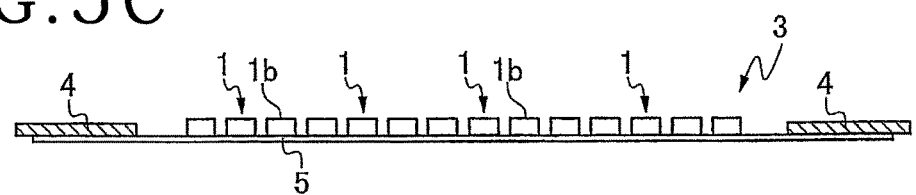

As shown in FIGS. 5A through 5C, an adhesive tape 5 is applied to the first faces 1a of the workpieces 1 which are opposite the second faces 1b thereof that have been fitted in the grooves 21 of the jig 2, for transferring the workpieces 1 to the adhesive tape 5. Specifically, as shown in FIG. 5A, the adhesive tape 5 is applied from above to an annular ring frame 4 having a central opening, exposing the adhesive surface of the adhesive tape 5 downwardly through the central opening of the annular ring frame 4. Thereafter, as shown in FIG. 5B, the adhesive surface of the adhesive tape 5 which is exposed downwardly through the central opening of the annular ring frame 4 is applied to the first faces 1a of the workpieces 1.

Figure 6:
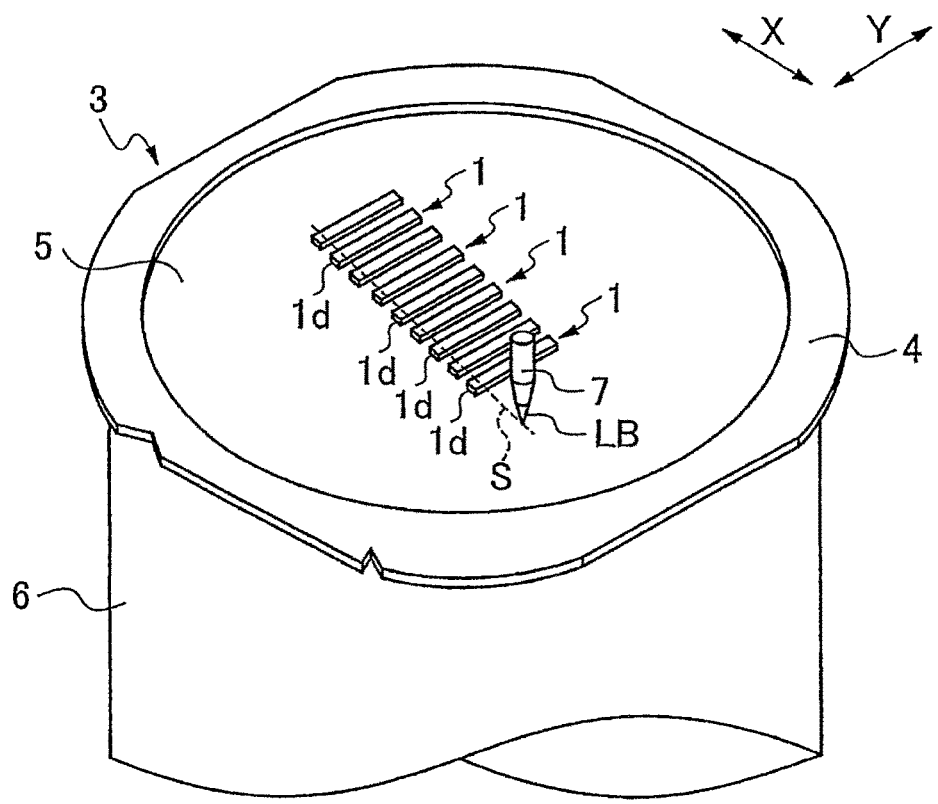
FIG. 6 is a perspective view showing a processing step.
Figure 7:
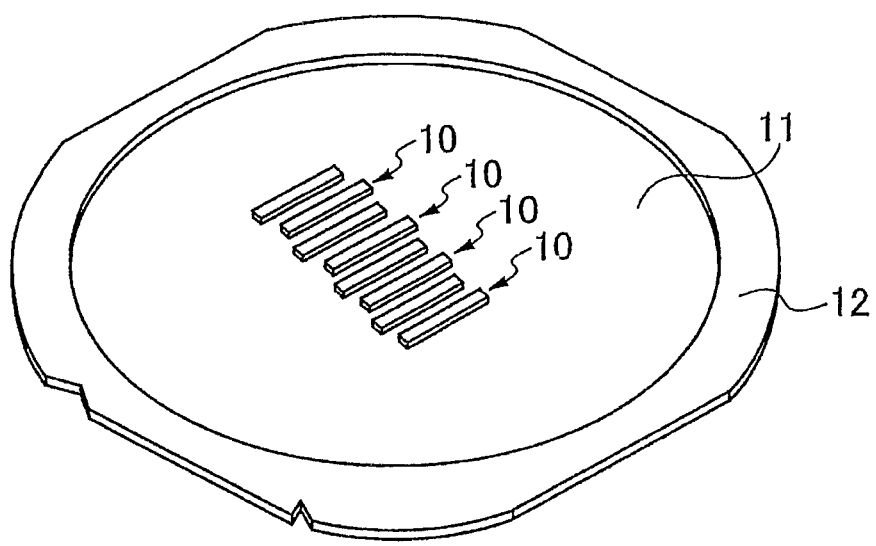
FIG. 7 is a perspective view of a conventional example in which a plurality of rectangular workpieces are arrayed and applied to an adhesive tape.

Then, as shown in FIG. 5C, the jig 2 is spaced apart from the workpieces 1, transferring the workpieces 1 to the adhesive tape 5 with the second faces 1b of the workpieces 1 facing upwardly. As a result, there is produced a workpiece set 3 where the workpieces 1 are integrally supported on the ring frame 4 by the adhesive tape 5. As shown in FIG. 6, the workpieces 1 are now arranged in a straight array on the adhesive tape 5 with the end faces 1d thereof aligned in line with each other.

(3) Processing Step

As shown in FIG. 6, laser scribing is carried out on the workpieces 1 thus arrayed on the adhesive tape 5 to form division starter points on the workpieces 1. The processing step according to the present embodiment is performed using a processing apparatus having at least a chuck table 6, which is movable in a processing feed direction (X-axis direction), for holding the workpiece set 3 thereon and laser processing means 7 for forming division starter points in the workpieces 1.

After the workpiece set 3 has been placed on and held by the chuck table 6, the chuck table 6 is moved to a position below the laser processing means 7. Then, while the chuck table 6 is being moved in the processing feed direction, the laser processing means 7 applies a laser beam LB having a predetermined wavelength to the workpiece set 3 along a projected dividing line S along which to divide the workpiece set 3, thereby forming division starter points in the workpieces 1.

Since the workpieces 1 are aligned straight with each other along the X-axis direction, the division starter points can be formed along the projected dividing line S on the workpieces 1 when the chuck table 6 is processing-fed in one stroke. Then, the chuck table 6 is indexing-fed a predetermined distance in a Y-axis direction, after which the laser beam LB is applied to the workpiece set 3 to form new division starter points again in all the workpieces 1. After all division starter points have been formed in the workpieces 1, the workpieces 1 are transported to a breaking apparatus, not shown, where external forces are imposed on the workpieces 1 to divide them into predetermined lengths, starting from the division starter points. The divided lengths or pieces are then processed and made as desired into components such as laser oscillator components for use in laser oscillators, for example.

In the processing step, rather than breaking the workpieces 1 after being processed by the laser scribing, the workpieces 1 may be fully cut by applying a laser beam thereto along the projected dividing line S once or a plurality of times.

The processing method according to the present invention includes the fitting step of fitting the workpieces 1 in the respective grooves 21 of the jig 2, the transferring step of applying the adhesive tape 5 to the first faces 1a of the workpieces 1 which are opposite the second faces 1b thereof that have been fitted in the grooves 21 of the jig 2 and transferring the workpieces 1 from the jig 2 to the adhesive tape 5 so that the workpieces 1 are arrayed in alignment with each other on the adhesive tape 5, and the processing step of processing the arrayed workpieces 1 on the adhesive tape 5. Consequently, the workpieces 1 can be applied in a straight array on the adhesive tape 5, and hence can be processed efficiently.

The material of the workpieces 1 to be processed according to the present invention is not limited to indium phosphide (InP). If the workpieces 1 are made of silicon (Si), silicon carbide (SiC), or the like, for example, then the processing step is not limited to the laser scribing, but the workpieces 1 may be scribed using a cutting apparatus or a scribing apparatus, before they are broken into predetermined lengths.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for processing a plurality of rectangular workpieces using a plate-shaped jig, comprising:

providing said plate-shaped jig having a plurality of grooves parallel to each other, said grooves being formed into a top face of the plate-shaped jig and having respective one ends aligned straight with each other and respective opposite ends each comprising an opening at a lateral side of the plate-shaped jig, and said grooves having a depth smaller than the thickness of the workpieces;

a fitting step of fitting the workpieces in the respective grooves of the jig by placing the workpieces in the respective grooves and bringing end faces of the respective workpieces into abutment against respective one ends of the grooves, wherein said fitting step comprises inserting each of the workpieces laterally through said openings at the lateral side of the jig;

a transferring step of, after the fitting step, applying an adhesive tape to first faces of the workpieces which are opposite second faces thereof that have been fitted in the grooves of the jig and transferring the workpieces from the jig to said adhesive tape, so that the workpieces are arrayed in alignment on the adhesive tape; and a processing step of, after the transferring step, processing the arrayed workpieces on said adhesive tape.

2. The processing method according to claim 1, wherein upon completion of said fitting step, at least some of said workpieces extend past said opening, because their length is greater than a corresponding length of an associated groove.

3. A processing method for processing a plurality of rectangular workpieces using a jig having a plurality of grooves parallel to each other, said grooves being formed into a top face of the jig and having respective one ends aligned straight with each other and respective opposite ends each comprising an opening at a lateral side of the jig, and said grooves having a depth smaller than the thickness of the workpieces, comprising:

a fitting step of fitting the workpieces in the respective grooves of the jig, wherein said fitting step comprises inserting each of the workpieces laterally through said openings at the lateral side of the jig;

a transferring step of, after the fitting step, applying an adhesive tape to first faces of the workpieces which are opposite second faces thereof that have been fitted in the grooves of the jig and transferring the workpieces from the jig to said adhesive tape, so that the workpieces are arrayed in alignment on the adhesive tape; and a processing step of, after the transferring step, processing the arrayed workpieces on said adhesive tape, wherein the processing step includes laser scribing to form division starter points on the workpieces and dividing the workpieces into predetermined lengths by imposing external forces.

4. The processing method according to claim 3, wherein upon completion of said fitting step, at least some of said workpieces extend past said opening, because their length is greater than a corresponding length of an associated groove.

* * * * *